United States Patent [19]

Kitamura

[11] Patent Number: 5,246,159
[45] Date of Patent: Sep. 21, 1993

[54] METHOD FOR FORMING A BUMP BY BONDING A BALL ON AN ELECTRODE OF AN ELECTRONIC DEVICE AND APPARATUS FOR FORMING THE SAME

[75] Inventor: Yoshihiro Kitamura, Tokyo, Japan

[73] Assignee: NEC Corporation, Japan

[21] Appl. No.: 912,053

[22] Filed: Jul. 7, 1992

Related U.S. Application Data

[63] Continuation of Ser. No. 552,144, Jul. 12, 1990.

[30] Foreign Application Priority Data

Jul. 19, 1989 [JP] Japan .................................. 1-187766

[51] Int. Cl.$^5$ ............................................. B23K 31/02
[52] U.S. Cl. ...................................... 228/179; 228/222
[58] Field of Search ................... 228/179, 4.5, 222

[56] References Cited

U.S. PATENT DOCUMENTS

| | | | |
|---|---|---|---|
| 3,934,108 | 1/1976 | Howard | 228/4.5 |
| 4,691,854 | 9/1987 | Haefling et al. | 228/4.5 |
| 4,750,666 | 6/1988 | Neugenbauer et al. | 228/4.5 |

FOREIGN PATENT DOCUMENTS

| | | | |
|---|---|---|---|
| 0567442 | 1/1981 | Japan | 228/4.5 |
| 61-46034 | 3/1986 | Japan | 228/4.5 |
| 62-150854 | 7/1987 | Japan . | |
| 0124435 | 5/1988 | Japan | 228/4.5 |

OTHER PUBLICATIONS

Research Disclosure, May 1989 Article. Implant Stand Off Technique for Mass Bonding. #301 Kenneth Mason Pub.

*Primary Examiner*—Mark Rosenbaum
*Assistant Examiner*—James Miner
*Attorney, Agent, or Firm*—Laff, Whitesel, Conte & Saret

[57] ABSTRACT

A method for forming a bump by bonding a ball on an electrode of an electronic device comprises the steps of forming a ball at a bottom end of a metallic wire held by a capillary by discharging between the metallic wire and a discharge electrode, fixing the ball on an electrode of an electronic device, and cutting the metallic wire to form a bump on the electrode, wherein the ball is formed just under the capillary to touch the bottom end of the capillary. The heat of the ball transfer to the capillary and the metallic wire inside the capillary does not recrystallize, so that the interface of recrystallization is positioned just above the ball, where endurance against the shearing stress is weak. As a result, the metallic wire is cut just above the ball, and a bump with no wire-shaped part is formed. An apparatus for forming a bump by bonding a ball on an electrode of an electronic device comprises a capillary for holding a metallic wire, a discharge electrode positioned face to face with the capillary, a power supply which constitutes together with the metallic wire and the electrode a circuit for discharging between the metallic wire and the discharge electrode to melt the metallic wire and form a ball at the bottom end of the metallic wire, a device for moving the capillary along the metallic wire to touch the ball at the bottom end of the capillary to make the heat of the ball transfer to the capillary, an instrument for fixing the ball on an electrode of an electronic device, and an instrument for cutting the metallic wire on just above the ball to form a bump with no wire-shaped part on the electrode.

6 Claims, 3 Drawing Sheets

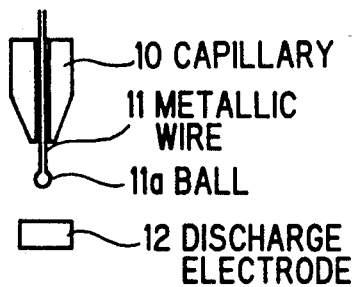
FIG. 1
PRIOR ART
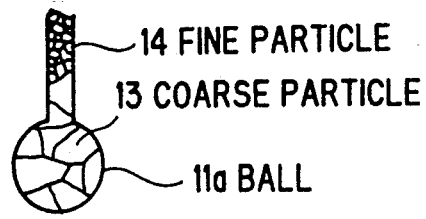
FIG. 2
PRIOR ART
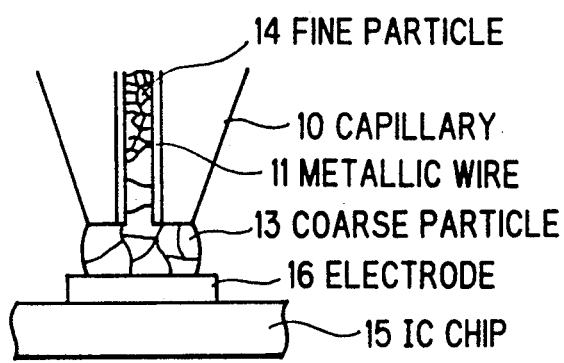
FIG. 3
PRIOR ART
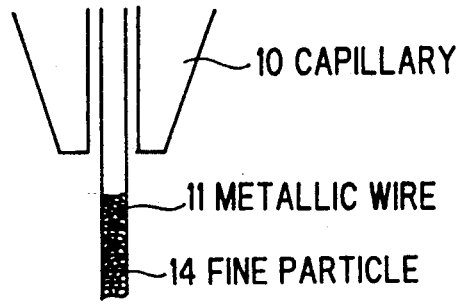
FIG. 5
PRIOR ART
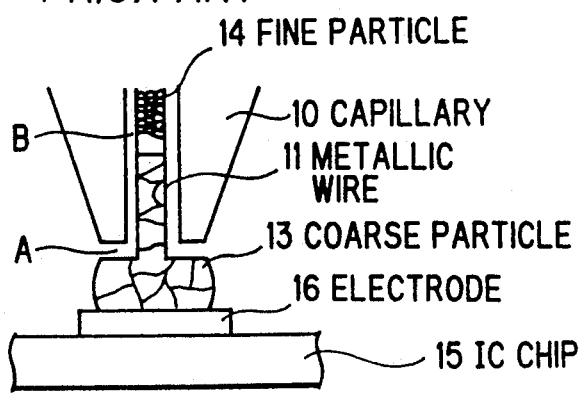
FIG. 4
PRIOR ART
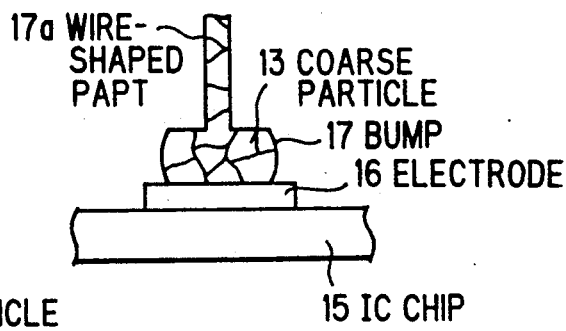

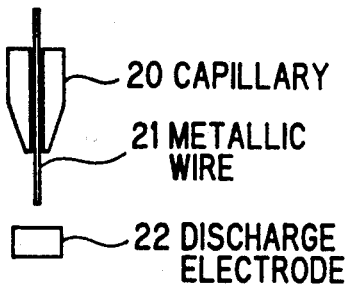
FIG. 6
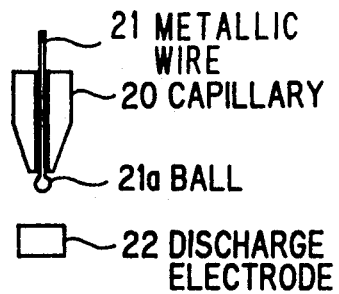
FIG. 7
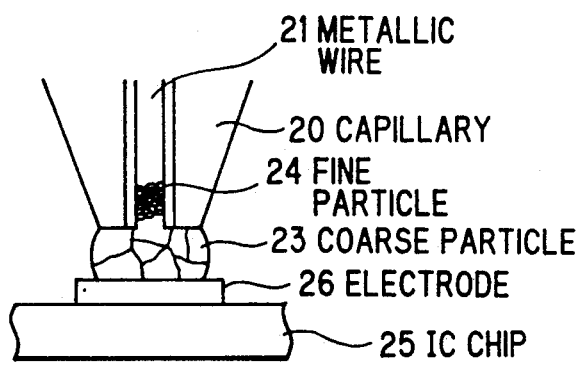
FIG. 8
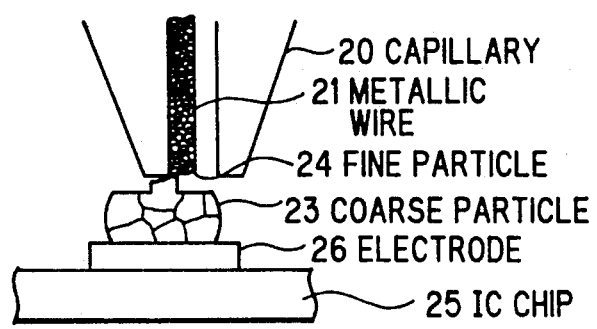
FIG. 9
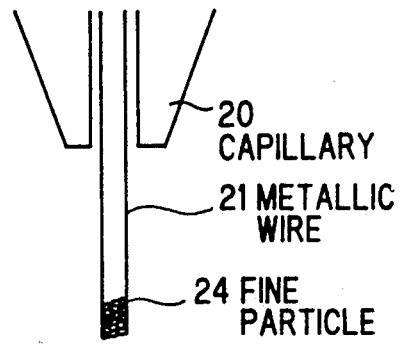
FIG. 10
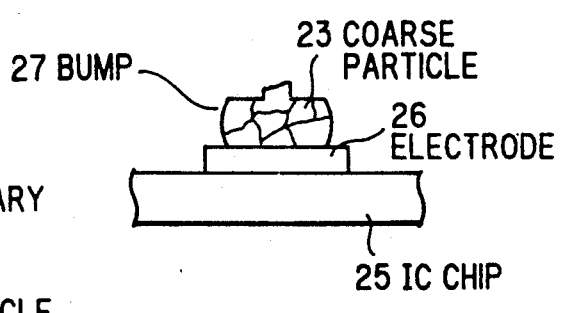

FIG. IIA
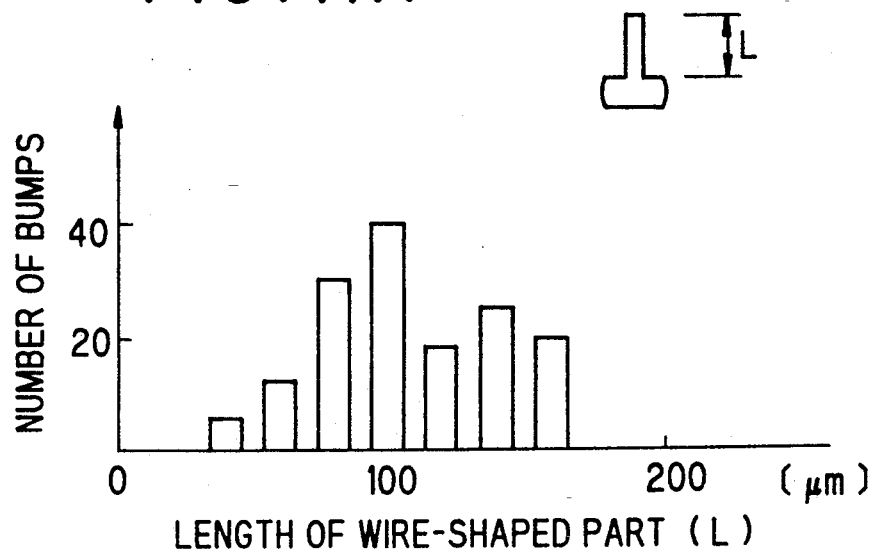
FIG. IIB
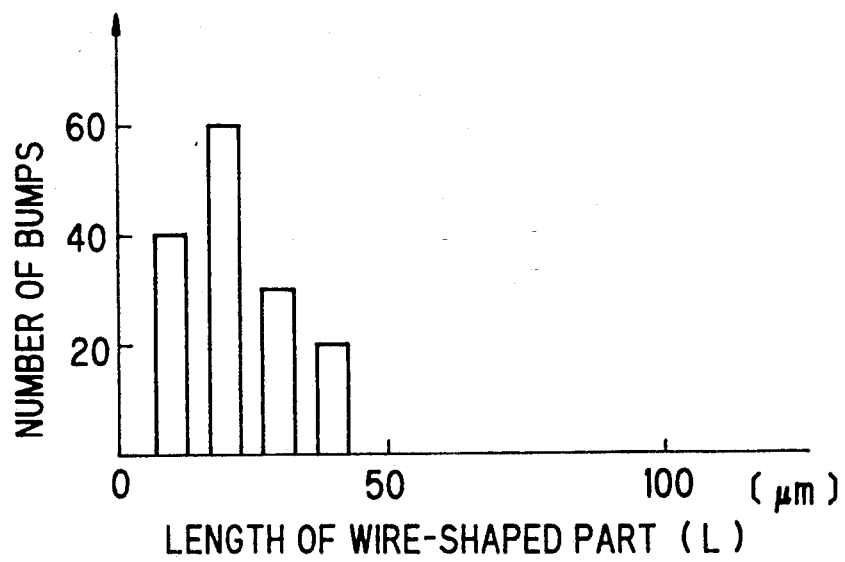

METHOD FOR FORMING A BUMP BY BONDING A BALL ON AN ELECTRODE OF AN ELECTRONIC DEVICE AND APPARATUS FOR FORMING THE SAME

This application is a continuation of application Ser. No. 07/552,144, filed Jul. 12, 1990.

FIELD OF THE INVENTION

The invention relates to a method for forming a bump by bonding a ball on an electrode of an electronic device and an apparatus for forming the same, and more particularly, to a method for forming a bump which has no wire-shaped part on the top thereof by bonding a ball on an electrode of an electronic device and an apparatus for forming the same.

BACKGROUND OF THE INVENTION

In manufacturing electronic devices such as IC chips, a metallic bump is formed on an electrode of an electronic device for wiring. A bump is formed usually by bonding a ball on the electrode using metallic wire. Such a type of a conventional method for forming a bump is described in the Japanese Patent Kokai No. 64-12555.

In the conventional method for forming a bump described therein, a capillary penetrated by a metallic wire is mounted above a discharge electrode. The distance between the bottom end of the capillary and the top surface of the discharge electrode is set usually from 1 mm to 2 mm, and the distance between the bottom end of the metallic wire and the top surface of the discharge electrode is set from 0.1 mm to 0.5 mm. When a discharge current flows between the metallic wire and the discharge electrode by adding a high voltage such as several thousand volts, the metallic wire gets a high temperature and melts from the bottom end thereof which is near the discharge electrode, then the molten part of the metallic wire becomes spherical and moves up along the metallic wire. Finally, a ball is formed at the bottom end of the metallic wire. The ball and the near part of the remaining metallic wire are recrystallized and coarse particles of crystals are formed. On the other hand, the upper part of the metallic wire is not recrystallized and has fine particles.

Then, the ball is mounted and fixed on an electrode of an electronic device by adding a ultrasonic vibration. The capillary is moved up from the ball to a predetermined position. Then, the metallic fatigue is imposed in the metallic wire to make a crack by adding a ultrasonic vibration. The metallic wire is pulled to be cut at the crack as the capillary moves up. As a result, a bump is formed on the electrode after cutting of the metallic wire.

In the conventional method for forming a bump, however, there is a disadvantage in that the metallic wire can be cut at the interface of recrystallization between the part of coarse particles and that of fine particles, usually 100 μm higher above the ball, where endurance against the shearing stress is smaller than the part where the metallic fatigue is imposed. Consequently, the bump has a wire-shaped part on the main part of the bump. This causes the expansion of the bump horizontally, because the wire-shaped part is crumbled in the process of reshaping of the bump or the inner lead bonding. As a result, the bump can touch the neighboring bump, which causes a short circuit.

SUMMARY OF THE INVENTION

Accordingly, it is an object of the invention to provide a method for forming a bump which has almost no wire-shaped part on the main part thereof by bonding a ball on an electrode of an electronic device.

It is a further object of the invention to provide an apparatus for forming a bump which has almost no wire-shaped part on the main part thereof by bonding a ball on an electrode of an electronic device.

According to a feature of the invention, a method for forming a bump by bonding a ball on an electrode of an electronic device comprises the steps of forming a ball at a bottom end of a metallic wire held by a capillary by discharging between the metallic wire and a discharge electrode, fixing the ball on an electrode of an electronic device, and cutting the metallic wire to form a bump on the electrode, wherein the ball is formed just under the capillary to touch the bottom end of the capillary.

According to another feature of the invention, an apparatus for forming a bump by bonding a ball on an electrode of an electronic device comprises a capillary for holding a metallic wire, a discharge electrode positioned face to face with the capillary, a power supply which constitutes together with the metallic wire and the electrode a means for discharging between the metallic wire and the discharge electrode to melt the metallic wire and form a ball at the bottom end of the metallic wire, means for moving the capillary along the metallic wire to touch the ball at the bottom end of the capillary to make the heat of the ball transfer to the capillary, means for fixing the ball on an electrode of an electronic device, and means for cutting the metallic wire on just above the ball to form a bump with no wire-shaped part on the electrode.

BRIEF DESCRIPTION OF THE DRAWING

The invention will be explained in more detail in accordance with following drawings wherein, FIG. 1 is an explanatory view illustrating a step of forming the ball at a bottom end of a metallic wire by discharging in accordance with the conventional method.

FIG. 2 is an explanatory view illustrating the lower part of a metallic wire including the ball after discharging shown in FIG. 1 in accordance with the conventional method.

FIG. 3 is an explanatory view illustrating a step of mounting and fixing the ball of FIG. 2 on a electrode of an IC chip in accordance with the conventional method.

FIG. 4 is an explanatory view illustrating a step of moving up a capillary from the ball in accordance with the conventional method.

FIG. 5 is an explanatory view illustrating a step of forming a bump by cutting the metallic wire in accordance with the conventional method.

FIG. 6 is an explanatory view illustrating a step of setting a metallic wire with a capillary and a discharge electrode for discharging in accordance with the invention.

FIG. 7 is an explanatory view illustrating a step of forming a ball at a bottom end of the metallic wire by discharging in accordance with the invention.

FIG. 8 is an explanatory view illustrating a step of mounting and fixing the ball on an electrode of an IC chip after discharging in accordance with the invention.

FIG. 9 is an explanatory view illustrating a step of cutting the metallic wire by moving the capillary horizontally in accordance with the invention.

FIG. 10 is an explanatory view illustrating a step of forming a bump by cutting the metallic wire in accordance with the invention.

FIGS. 11A and 11B are bar graphs representing distributions of the length of wire-shaped part of bumps.

DESCRIPTION OF THE PREFERRED EMBODIMENT

Before describing a method for forming a bump and an apparatus for forming the same according to the invention, a conventional method for forming a bump and apparatus for forming the same briefly described before will be explained in conjunction with FIGS. 1 to 5.

FIG. 1 shows a step of forming a ball 11a at a bottom end of a metallic wire 11 by discharging, wherein a capillary 10 penetrated by the metallic wire 11 is mounted above a discharge electrode 12.

FIG. 2 shows the lower part of the metallic wire 11 after discharging. The ball 11a and the near part of the remaining metallic wire 11 are recrystallized, so that coarse particles 13 of crystals are formed wherein. On the other hand, the upper part of the metallic wire 11 has fine particles 14 therein.

FIG. 3 shows a step of mounting the ball 11a on a electrode 16 of an IC chip 15. The ball 11a is fixed on the electrode 16 by adding a ultrasonic vibration.

FIG. 4 shows a step of moving up the capillary 10. A metallic fatigue is imposed at the point A just above the ball 11a in the metallic wire 11 to make a crack by adding a ultrasonic vibration. But, the metallic wire 11 can be cut at the point B which is an interface between the part of coarse particles 13 of crystals and that of fine particles 14.

FIG. 5 shows a step of forming a bump 17 by cutting the metallic wire 11. The metallic wire 11 is pulled to be cut at the interface of recrystallization as the capillary 10 moves up, so that the bump 17 has a wire-shaped part 17a on the main part of the bump 17.

Next, preferred embodiments of the invention will be described in detail in conjunction with FIGS. 6 to 11.

FIG. 6 shows a step of forming a ball at a bottom end of a metallic wire by discharging, wherein a capillary 20 penetrated by a metallic wire 21 is mounted above a discharge electrode 22. The distance between the bottom end of the capillary 20 and the top surface of the discharge electrode 22, and the distance between the bottom end of the metallic wire 21 and the top surface of the discharge electrode 22, are respectively set as the same as in the conventional method. A discharge current flows between the metallic wire 21 and the discharge electrode 22 by adding a high voltage by a power supply (not shown) to heat and melt the metallic wire 21 from the bottom end thereof, like the case of the conventional method described before.

Then, as shown in FIG. 7, the capillary 20 is moved down to touch the ball 21a at the bottom end thereof while discharging is under way, so that the heat of the ball 21a transfers to the capillary 20 and the metallic wire 21 inside the capillary 20 is not heated to avoid the recrystallization thereof. As a result, the recrystallization may not occur in the remaining metallic wire 21 inside the capillary 20 but only in the ball 21a, so that the interface of recrystallization is positioned just above the ball 21a. When the length of the metallic wire 21 outside the capillary 20 is limited approximately from 0.3 mm to 0.5 mm, it is not necessary to move the capillary 20. In this case, the molten part of the metallic wire 21 rises up to touch the bottom end of the capillary 20, so that the heat of the ball 21a transfers to the capillary 20 and fails to transfer to the remaining metallic wire 21 inside the capillary 20.

Then, the metallic wire 21 with the ball 21a at the bottom end thereof held by capillary 20 is moved from the discharge electrode 22 toward an IC chip 25, and the ball 21a is fixed on an electrode 26 of the IC chip 25 by adding a ultrasonic vibration, as shown in FIG. 8. The capillary 20 is slightly moved up and then moved horizontally parallel to the interface of the recrystallization, which causes the shearing stress at the interface thereof where the metallic wire 21 is to be cut, as shown in FIG. 9. Then, the capillary 20 is moved up to pull the metallic wire 21 already cut, and a bump 27 is formed, as shown in FIG. 10. The resultant bump 27 has almost no wire-shaped part.

FIGS. 11A and 11B show distributions of the lengths of wire-shaped part of bumps according to the conventional method and the present invention, respectively. In FIG. 11A, the averaged lengths of the wire-shaped part of bumps which is formed by the conventional method is relatively long. On the other hand, in FIG. 11B, the averaged lengths thereof according to the present invention is relatively short.

In the embodiment described above, if the metallic wire 21 is connected with the positive terminal of the power supply and the discharge electrode 22 with the negative terminal thereof during discharging, electrons converge on the bottom end of the metallic wire 21, so that only the bottom end thereof tends to be heated. As a result, the recrystallization occurs only in the ball 21a, and a bump with no wire-shaped part can be obtained like the embodiment already described before.

Although the invention has been described with respect to specific embodiment for complete and clear disclosure, the appended claims are not to thus limited but are to be construed as embodying all modification and alternative constructions that may occur to one skilled in the art which fairly within the basic teaching herein set forth.

What is claimed is:

1. A method for forming a bump by bonding a ball on an electrode of an electronic device, said method comprising the steps of:

forming a ball at a bottom end of a metallic wire held by a capillary by discharging between said metallic wire and a discharge electrode positioned to face a bottom end of said capillary, the heat of the formed ball being transferred directly by the capillary without substantially heating the wire held within the capillary in order to avoid a recrystallization thereof;

fixing said ball on an electrode of an electronic device;

moving the capillary horizontally parallel to an interface of recrystallization for cutting said metallic wire to form a bump on said electrode; and moving the capillary up to pull the cut metallic wire wherein said ball is formed just under said capillary to touch the bottom end of said capillary.

2. A method for forming a bump by bonding a ball on an electrode of an electronic device, according to claim 1:

wherein said step of forming a ball at a bottom end of a metallic wire includes moving said capillary down to touch said ball to avoid recrystallization of said metallic wire inside said capillary.

3. A method for forming a bump by bonding a ball on an electrode of an electronic device, according to claim 1:

wherein a jutting part of said metallic wire from said capillary is limited in its length so that said ball rises to touch said capillary at a time of said discharging.

4. A method for forming a bump by bonding a ball on an electrode of an electronic device, according to claim 1:

wherein said step of cutting said metallic wire includes moving said capillary horizontally to add a shearing stress to said metallic wire.

5. A method for forming a bump by bonding a ball on an electrode of an electronic device, according to claim 1:

wherein said step of cutting said metallic wire includes adding a ultrasonic vibration.

6. A method for forming a bump by bonding a ball on an electrode of an electronic device, according to claim 1:

wherein said step of forming a ball at a bottom end of a metallic wire by discharging between said metallic wire and a discharge electrode includes connecting said metallic wire the positive terminal of a power supply and said discharge electrode with the negative terminal of said power.

* * * * *